INVENTORS
JOSEPH F. LIDOSKI &
JAMES V. MASI
BY
MAHONEY, MILLER & RAMBO
BY Wm. V. Miller
ATTORNEYS INVENTORS
JOSEPH F. LIDOSKI &
JAMES V. MASI
BY
MAHONEY, MILLER & RAMBO
BY Wm. V. Miller
ATTORNEYS United States Patent Office 3,474,379

Patented Oct. 21, 1969

3,474,379

CONTACT CONNECTOR ASSEMBLY FOR ELECTRICAL DEVICES HAVING THIN-FILM ELECTRODES

Joseph F. Lidoski, Bellerose, and James V. Masi, Huntington, N.Y., assignors to Mid-Continent Manufacturing Co., Columbus, Ohio, a corporation of Ohio Filed June 26, 1967, Ser. No. 648,925
Int. Cl. H05k *1/04;* H02b *1/04;* H01j *63/02*
U.S. Cl. 339—17 7 Claims

ABSTRACT OF THE DISCLOSURE

Interconnection of an electrical circuit with an electrical device formed with thin-film electrodes is facilitated by a contact connector assembly which may be supported in assembled relationship with the device and which comprises a dimensionally stable, dielectric substrated and a plurality of contacts on a surface of the substrate for contacting engagement with the device electrodes. Electrical conductors connected to the contacts are brought out to external terminals mounted on the substrate and which are connectable with the electrical circuit.

Electrical connection of electronic devices to associated circuitry presents a unique problem in the case of miniaturized or microminiaturized electronic devices. These devices commonly utilize thin film electrodes that may be formed by well known processes, such as printed circuit techniques, and it is to these electrodes or electrode areas that an electrical circuit must be completed for incorporation of the device into the associated circuit. Electrodes of this type are inherently structurally weak as a consequence of the physical characteristiscs of construction and direct mechanical connection of electrical conductors to these electrodes imposes a severe structural strain on the electrodes unless the electrical conductors may also be otherwise rigidly secured in fixed relationship to the electronic device and thereby absorb mechanical strains that may be applied and transmitted by the conductors.

Another problem associated with miniaturized electrical devices is the physical space limitation imposed as a result of the multiplicity of electrodes and connections required within a relatively small space. A common technique utilized in forming a mechanical and electrical connection between devices and conductors consists of bonding the conductor to the electrode by heat-generating soldering processes. While soldering processes are suitable in situations whereby the devices have sufficient mass to absorb the heat thus generated without damage to the components, soldering processes are not generally applicable to electronic devices of the miniaturized type as the heat absorption capacity is very limited.

A specific application of the contact connector assembly of this invention is in display devices which utilize electroluminescent cells for generation of radiation in forming a visual display. An electroluminescent cell comprises, in general, a layer of electroluminescent material sandwiched between two electrically-conductive layers or sheets with the electroluminescent material excited in response to the application of an electric potential across the electrically conductive layers. The electrically-conductive sheets are often relatively thin and are, accordingly, extremely fragile. In addition, the number of electrodes and electrical connections required in a particular display device may easily approach a value where it is impossible to construct the electrodes in such a manner as to withstand the mechanical forces that may be applied through conventional connecting techniques. This problem of providing a suitable electrical connection to electrical devices having thin film electrodes is solved through the utilization of an intermediate device constructed in accordance with this invention and comprising a contact connector assembly which is provided with rigid electrical terminals for connection with conductors by solder-type connections and is also provided with flat-surface electrode-contacts capable of forming a pressure contact with the electrodes of the particular electronic device. This contact connector assembly provides a dimensionally stable termination for the electrical circuit which operates or is driven by the electronic device and forms the necessary electrical contact with the electrodes of the device without endangering the structural or electrical integrity of that device.

These and other objects and advantages of this invention will be readily apparent from the following detailed description and the accompanying drawings of an embodiment thereof.

Figures 1, 2:
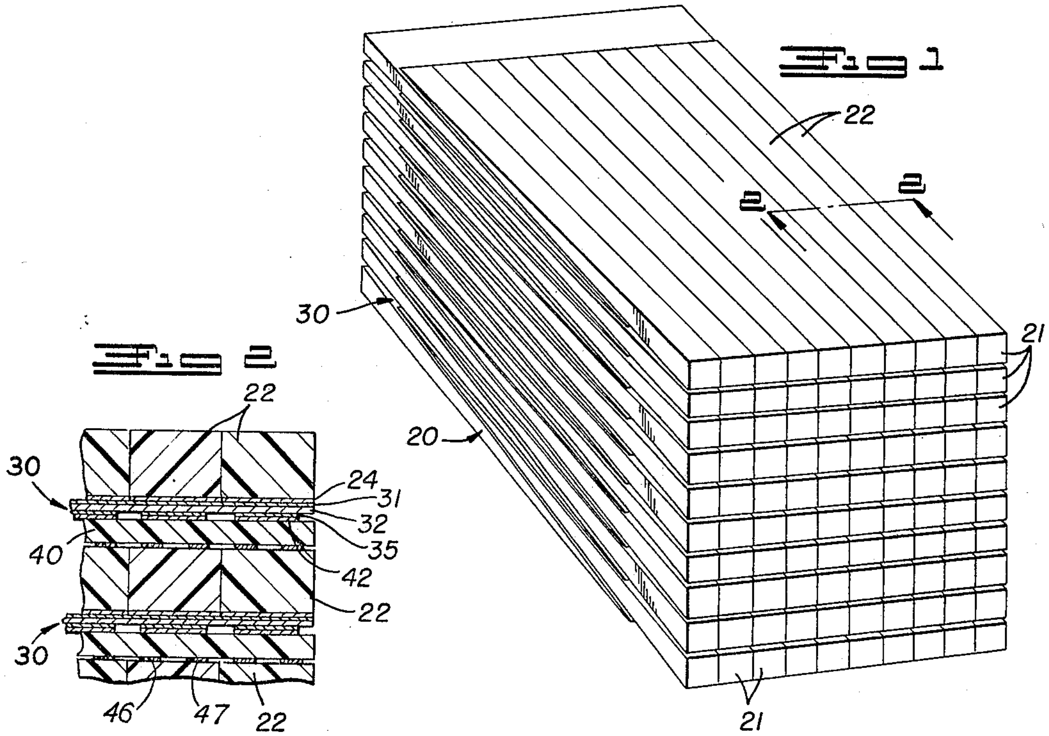
FIGURE 1 is a perspective view of a visual display device of the multi-element type and which incorporates electrical contact connector assemblies of this invention.
FIGURE 2 is a fragmentary sectional view on an enlarged scale taken along a vertical plane extending through line 2—2 of FIGURE 1.
Figure 3:
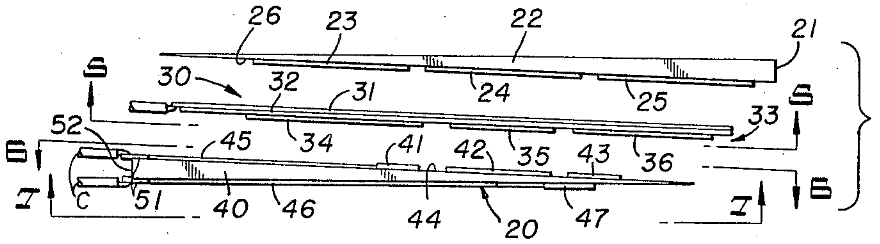
FIGURE 3 is an exploded side elevational view of one of the layers of display elements.
Figure 4:
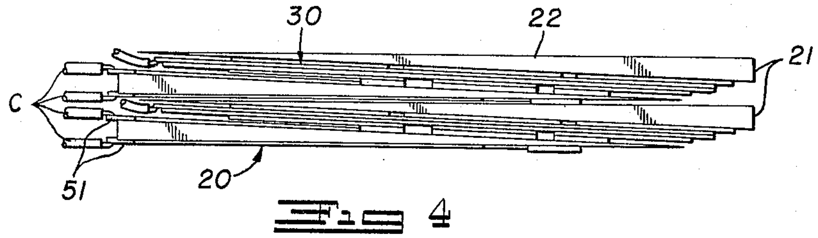
FIGURE 4 is a side elevational view of several of the layers of the display device of FIGURE 1.

Having reference to the drawing and in particular to FIGURE 1, a multi-element visual display device is shown which incorporates several contact connector assemblies 20 of this invention to illustrate a specific application of the contact connector assemblies. The illustrated visual display device is of an edge emission type in which one or more of one hundred elemental surface areas 21 arranged in 10 layers of 10 each in a single planar surface may be selectively illuminated to form a composite image at the viewing surface. Each surface area 21 is an end surface of a light-transmitting conduit 22 (see FIGS. 2 and 3) which is of a rectangular cross section and in the illustrated embodiment has a triangular, longitudinal section. A thin layer of photoluminescent material divided into three sections 23, 24, and 25 is coated by a suitable process on one surface 26 of the light-transmitting conduit 22. The specific photoluminescent material utilized in forming each of the three areas 23, 24 and 25 is selected to provide the desired color characteristics for the illustrated device and in this instance the materials selected are such that, when appropriately irradiated, radiation within the red, green and blue wavelength spectrum, respectively, will be emitted. This radiation thus emitted by the photo luminescent material will enter the light-transmitting conduit 22 and, due to the optical characteristics of the material chosen, will have a substantial portion totally internally reflected and this internally reflected radiation will subsequently exit at the elemental surface area 21 for viewing purposes. Through selective irradiation of the specific photoluminescent material areas 23, 24 and 25, a selected color may be obtained at the viewing surface or a composite color hue may be modified through control of the degree of irradiation applied to each of the photoluminescent materials.

Figure 5:
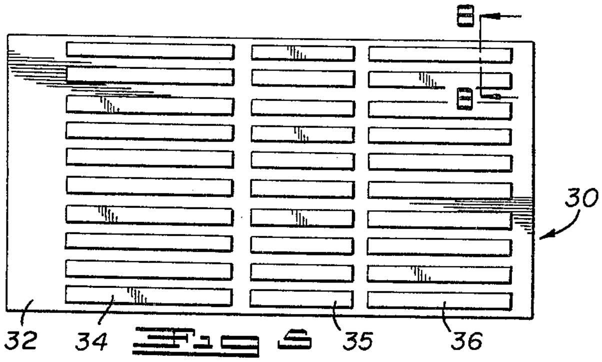
FIGURE 5 is a bottom plan view of an electroluminescent cell incorporated in the display device of FIGURE 1 and taken along line 5—5 of FIGURE 3.
Figure 8:
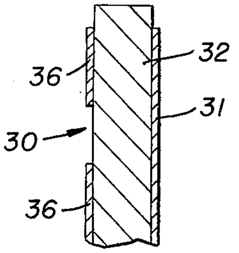
FIGURE 8 is an enlarged, fragmentary sectional view taken along line 8—8 of FIGURE 5.
Figure 6:
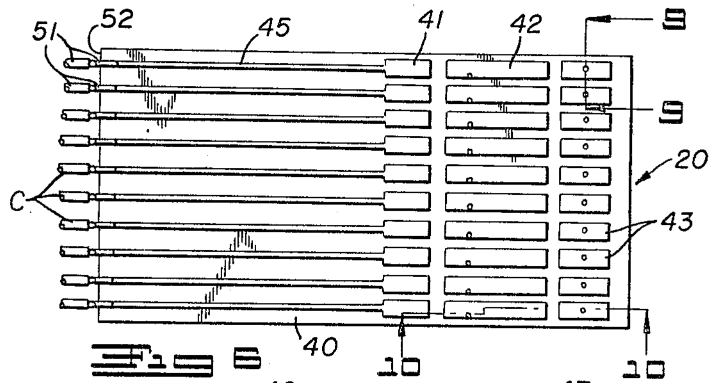
FIGURE 6 is a top plan view of the contact connector assembly taken along line 6—6 of FIGURE 3.
Figure 9:
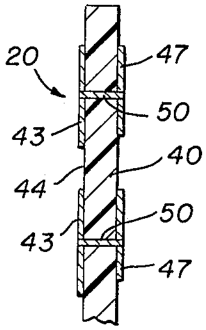
FIGURE 9 is an enlarged, fragmentary sectional view taken along line 9—9 of FIGURE 6.
Figures 7, 10:
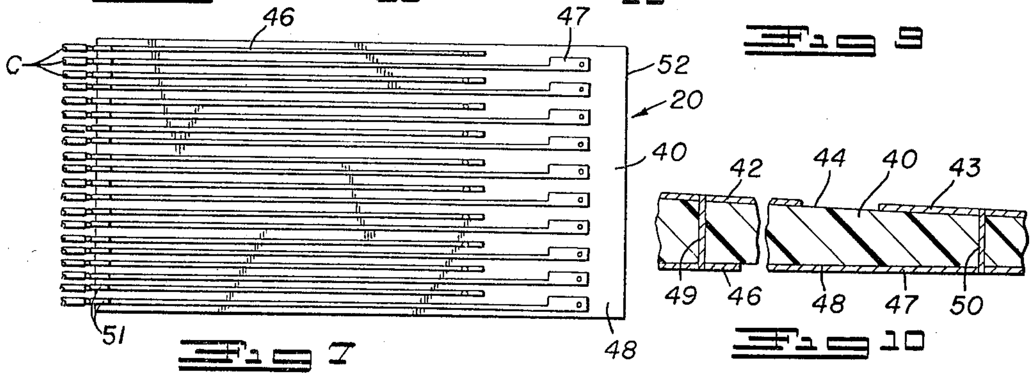
FIGURE 7 is a bottom plan view of the contact connector assembly taken along line 7—7 of FIGURE 3.
FIGURE 10 is an enlarged, fragmentary sectional view taken along line 10—10 of FIGURE 6.

Irradiation of the photoluminescent material areas 23, 24 and 25 is effected in the illustrated embodiment by means of several electroluminescent cells or lamp structures designated generally at 30 with one such lamp structure being juxtaposed to each layer of 10 light-transmitting conduits 22. Each electroluminescent lamp structure 30 is designed to permit selective irradiation of the desired photoluminescent material areas 23, 24 and 25 of each of the 10 light-transmitting conduits 22 forming the associlayer of conduits. Construction of the electroluminescent lamp structure 30 to attain this object is further illustrated by FIGURES 5 and 8 in addition to the FIGURES 2 and 3. As can be readily seen by reference to these figures, the lamp structure 30 comprises, in superposed, planar relationship, a sheet-form, transparent electrode 31, a layer of electroluminescent material and an electrode array 33 arranged at the opposite side of the layer of electroluminescent material. While the transparent electrode 31 and layer of electroluminescent material 32 are substantially coextensive to each other and to the combined surface area presented by a layer of light-transmitting conduits 22, the electrode array 33 comprises a multiplicity of electrically discrete electrodes which are are arranged in three groups as can be best seen by reference to FIGURE 5. Each group of electrodes includes ten each similar electrodes 34, 35 and 36 arranged in the first, second and third groups. Each of the electrodes 34, 35 and 36 is relatively arranged as to the electroluminescent lamp structure 30 as to coincide with a respective area of photoluminescent material 23, 24 and 25 formed on the light-transmitting conduits 22 of the specific layer. Thus, the application of an appropriate electric potential to any one of the electrodes 34, 35 or 36 in any one of the groups will thus serve to activate only that electroluminescent material which is coextensive with that specific electrode and thus emit radiation in only that area. Thus, the application of a potential to a particular electrode 34, 35 or 36 will only serve to irradiate a particular area of photoluminescent material, such as 23, 24 or 25, on a respective light-transmitting conduit 22 and result in emission of only that particular light at the respective elemental surface area 21. It will be readily apparent that activation of more than one of electroluminescent material through the application of electric potential to the selected electrodes in any of the three groups will provide a composite image at the face of the visual display device as would be determined by the input signal comprising a suitable electric potential applied to the desired electrodes 34, 35 and 36 of any of the electroluminescent lamp structures 30 for each of the respective layers formed by the light-transmitting conduits 22.

In the construction of the electroluminescent lamp structure 30, the electrodes 34, 35 and 36 are formed by deposition or coating of a relatively thin film of electrically conductive material onto a surface of the electroluminescent material 32. Such relatively thin electrodes thus present a problem in obtaining a suitable electrical connection between the electrodes and an associated electric circuit which controls the application of a potential to the electroluminescent lamp structure. Not only are the thin-film electrodes incapable of providing the necessary structural integrity in a practical electrical device but it is difficult to physically achieve a suitable mechanical connection for electrical continuity. The problem of making the necessary electrical connections to the specific electrodes is further compounded by the generally small size and configuration of visual display devices of the electroluminescent type. In this particular illustration, the visual display device may present a viewing area of the order of one square inch and, with one hundred light-transmitting conduits 22 each having a requirement for three distinct electrical connections, results in the necessity of connecting three hundred electrical conductors to these electrodes in addition to the connections to the 10 transparent electrodes 31.

In accordance with this invention, the problem of making the numerous electrical connections in a relatively small space is effectively solved through the utilization of contact connector assemblies 20 which may be readily assembled with the light-transmitting conduits 22 and electroluminescent lamp structures 30 into a visual display device. Specific constructional details of a contact connector assembly 20 may be best seen by reference to FIGURES 3, 6, 7, 9, and 10 of the drawings. Each contact connector assembly is designed to provide an electrically discrete connection to each of the electrodes 34, 35 and 36 of an electroluminescent lamp structure 30 which is associated with a specific layer of light-transmitting conduits 22. In this specific embodiment of the invention, each contact connector assembly 20, which is coextensive with a respective one of the electroluminescent lamp structure, 30, comprises a dielectric substrate 40 and a plurality of discrete electrical contacts 41, 42 and 43. These electrical contacts 41, 42 and 43 are disposed on a planar surface 44 of the dielectric substrate 40 in three linearly arranged groups of 10 electrodes each with the specific arrangement and size of the electrical contacts being such as to result in coincidence of each contact with a respective electrode 34, 35 or 36 of the electroluminescent lamp structure 30. With the electrical contacts 41, 42 and 43 thus arranged on the dielectric substrate 40, juxtaposition of a contact connector assembly 20 to an electroluminescent lamp structure 30 with the surface 44 adjacent the electrode array 33 will result in formation of the desired electrical mechanical engagement of the electrodes 34, 35 and 36 with the respective contacts.

The electrode contacts 41, 42 and 43, which are formed of electrically conductive material, may be formed on the dielectric substrate 40 by printed circuit techniques or by other suitable methods. Irrespective of the particular technique or method utilized, each contact is formed as a thin plate with a surface area which will be adaquate to transmit electrical power for the particular electrical device and may not be coextensive with the entire electrode with which it is associated. The substrate 40 is also of triangular configuration in longitudinal section to complement the triangular configuration of the light-transmitting conduits 22 and thus form a composite rectangular shape when assembled into a display device. Utilization of this triangular configuration permits a substantial reduction in the overall size of the display over that of a rectangular configuration without a material reduction in the structural strength of the assembled display device while maintaining a maximum viewing area. Also, it will be noted that while the layers of light-transmitting conduits 22 and the respective contact connector assemblies are interleaved when assembled, they are not fully overlapped to permit assembly with the electroluminescent lamp structure 30 without resulting in a detracting space between the layers of surface areas 21 which form the viewing surface. In the illustrated display device, the dielectric substrate 40 is formed from a material which is structurally rigid as are the light-transmitting conduits 22 although it will be understood that a contact connector assembly could be constructed so as to be flexible provided dimensional stability is maintained for proper relative spacing of the contacts and engagement with the electrodes of an associated electrical device.

Although not shown, a completely assembled visual display devices as shown in FIGURE 1 would be maintained in this assembled relationship through utilization of appropriate framing or supporting structures which provide the necessary structural integrity for the unit as well as protection for the components of the device. This may be accomplished through well known encapsulation processes or mechanical structures and, therefore, is not illustrated in the drawings.

Connection of an external electric circuit to the respective electrical contacts 41, 42 and 43 is conveniently accomplished by providing electrical conductors or bus bars 45, 46 and 47 which project along a surface of the dielectric substrate 40 toward an end edge 52 of the substrate. A group of such conductors 45 are formed on the surface 44 of the substrate and connect with the electrodes 41. Groups of conductors 46 and 47 which are designed to connect with the respective contacts 42 and 43 are arranged on an opposite surface 48 of the substrate and also project toward the end 52 of the substrate. Printed circuit techniques may also be utilized in the formation of the conductors 45, 46 and 47. With such techniques, the conductors may be readily formed as thin films of electrically conducting materials on the surfaces 44 and 48 of the substrate 40. Since the electrical conductors 46 and 47 are formed on the surface 48 opposite the surface 44 on which the electrical contacts 42 and 43 are formed, it is necessary that an electrical interconnection be provided. This interconnection is formed by electrically conductive elements 49 and 50 that extend through apertures formed in the substrate 40 and are electrically bonded to the respective contacts and conductors.

Each of the contact connector assemblies 20 of this embodiment of the invention are also provided with pin-type terminals 51 for facilitating connection with each of the electrical conductors 45, 46 and 47. These terminals 51 may be formed by structurally rigid pins which may be at least partially embedded in the substrate for mechanical integrity of the unit. External electric conductors C may be readily connected to the contact connector assembly 20 by means of the pin-type terminals 51. Some terminals 51 and conductors C have been omitted from FIGURES 1, 6 and 7 to simplify illustration. Although a pin-type terminal connection is shown for the specific contact connector assembly 20 illustrated in the drawings, it will be understood that this external circuit connection may be accomplished by other means well known to those skilled in the art. For example, it is entirely feasible for the conductors 45, 46 and 47 to be formed with adequate structural integrity to permit direct electrical connection with an external circuit either through direct circuit connections with the conductors or by means of a pressure type contact block.

Figure 11:
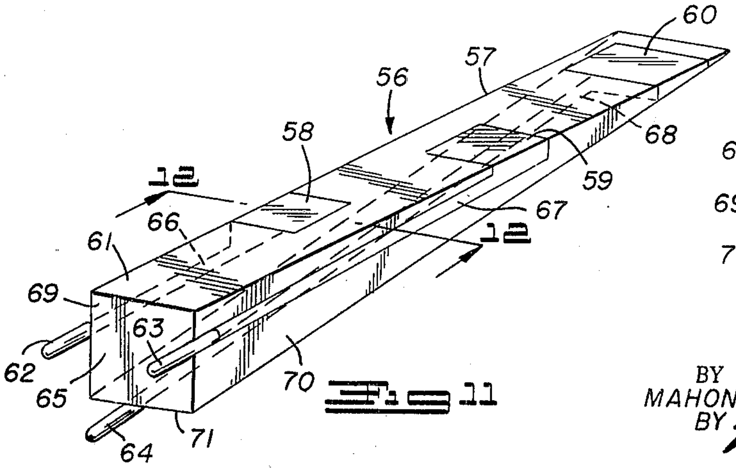
FIGURE 11 is a perspective view of a modified contact connector assembly designed for use with a single element display device.
Figure 12:
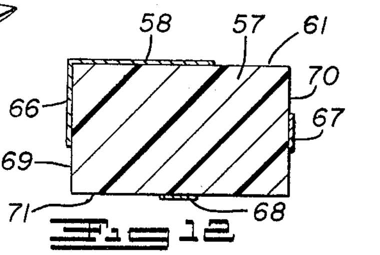
FIGURE 12 is an enlarged, transverse sectional view taken along a vertical plane extending through line 12—12 of FIGURE 11.

While the contact connector assembly 20, previously illustrated and described is designed for utilization in a multi-element visual display device, a contact connector assembly embodying this invention may be designed for single unit display purposes. Such a modified contact assembly is shown in FIGURES 11 and 12. This contact connector assembly, designated generally by the numeral 56, comprises a wedge-shaped dielectric substrate 57 and a plurality of electrical contacts 58, 59 and 60. In this modification, each of the electrical contacts 58, 59 and 60 has a rectangularly shaped surface area and may be formed by a suitable method, such as a printed circuit technique, on a surface 61 of the dielectric substrate 57. External circuit connection is made to each of the respective contacts 58, 59 and 60 through pin-type terminals 62, 63 and 64 which are carried at an end of the substrate 57 and project from an end surface 65. Flat electrical conductors 66, 67 and 68 are formed on each of the other three respective surfaces 69, 70 and 71 of the substrate and interconnect a respective terminal 62, 63 and 64 with a respective one of the contacts 58, 59 and 60. Consequently, the contact connector assembly 56 may be supported in assembled relationship with an electrical device (not shown) requiring connection at three electrically discrete points in the manner described in connection with the display device of FIGURE 1. This contact connector assembly will also be capable of providing the necessary structural integrity and electrical circuit connection for the unit.

It is readily apparent from this detailed description that the contact connector assemblies of this invention greatly facilitate interconnection of an electrical circuit with an electrical device provided with a multiplicity of thin-film electrodes. Structural and electrical integrity of the electrical device is not impared since a contact connector assembly of this invention effects completion of an electric circuit to the device through contacting engagement and thereby eliminates the requirement for a mechanically secured attachment of conductors directly to the fragile, thin-film electrodes. Utilization of a contact connector assembly of this invention enhances compactness of design while permitting connection of a large number of electrodes to an electrical circuit.

According to the provisions of the patent statutes, the principles of this invention have been explained and have been illustrated and described in what is now considered to represent the best embodiment.

Having thus described this invention, what is claimed is:

1. In an electrical apparatus, an electrical device having a surface provided with at least one thin-film electrode of finite surface area, and a contact connector assembly positionable in assembled relationship with said electrical device comprising:

(A) a dielectric, structurally rigid substrate of elongated, wedge-shaped form having a surface which is juxtaposed to said electrical device surface and an end edge surface, (B) at least one electrical contact of finite surface area formed on the surface of said substrate for contactingly engaging said electrical device electrode, the surface areas of said electrode and said contact being at least partially coextensive and overlapping, (C) at least one electrical conductor carried by said substrate and connected with said electrical contact, said conductor extending from said contact to a remote termination on said substrate adjacent said end edge surface, and (D) at least one structurally rigid connector terminal secured to said substrate and connected with said electrical conductor, said terminal projecting a distance axially outward from said end edge-surface.

2. A contact connector assembly comprising:

(A) a dielectric, structurally rigid substrate of elongated, wedge-shaped form forming a structural support and having a longitudinal surface and an end edge-surface, (B) at least one electrical contact of finite surface area formed on said longitudinal substrate surface for contactingly engaging an electrode surface, (C) at least one electrical conductor carried by said substrate and connected with said electrical contact, said conductor extending a distance from said contact to a remote termination on said substrate adjacent said end edge surface, and (D) at least one structurally rigid connector terminal secured to said substrate and connected with said electrical conductor, said terminal projecting a distance axially outward from said end edge-surface.

3. A contact connector assembly according to claim 2 which includes a plurality of said electrical contacts formed on said longitudinal substrate surface in electrically discrete relative relationship, and a plurality of said electrical conductors carried by said substrate with each conductor connected with a respective one of said electrical contacts, each of said electrical conductors extending a distance from said contact connected therewith to a respective remote termination on said substrate adjacent said end edge surface.

4. A contact connector assembly according to claim 3 wherein all of said electrical contacts are disposed in longitudinally spaced relationship along the longitudinal axis of said substrate.

5. A contact connector assembly according to claim 3 which includes a structurally rigid connector terminal carried by said substrate for each of said electrical contacts, each of said terminals secured to said substrate and projecting a distance axially outward from said end edge surface and connected with a respective one of said electrical conductors.

6. A contact connector assembly according to claim 3 which includes at least two groups of a plurality of said electrical contacts formed on said longitudinal substrate surface with said contacts in each of said groups disposed in longitudinally spaced relationship along the longitudinal axis of said substrate, and with said group of contacts disposed in spaced parallel relationship.

7. A contact connector assembly according to claim 6 wherein said electrical conductors connected with said electrical contacts next adjacent to said end edge surface are formed on said longitudinal substrate surface and all other conductors are formed on an opposed longitudinal substrate surface, said all other conductors being connected with a respective contact by electrically conductive means extending through an aperture formed in said substrate.

References Cited

UNITED STATES PATENTS

| | | |
|---|---|---|
| 2,769,119 | 10/1956 | Martin et al. |
| 2,998,546 | 8/1961 | Kuntz et al. |
| 3,035,244 | 5/1962 | Aveni. |
| 3,037,181 | 5/1962 | Leshner. |
| 3,130,348 | 4/1964 | Lieb. |

MARVIN A. CHAMPION, Primary Examiner

PATRICK A. CLIFFORD, Assistant Examiner

U.S. Cl. X.R.

313—108; 317—101